US009190405B2

(12) United States Patent
Chen et al.

(10) Patent No.: US 9,190,405 B2
(45) Date of Patent: Nov. 17, 2015

(54) DIGITAL CIRCUIT DESIGN WITH SEMI-CONTINUOUS DIFFUSION STANDARD CELL

(71) Applicant: QUALCOMM Incorporated, San Diego, CA (US)

(72) Inventors: Xiangdong Chen, Irvine, CA (US); Ohsang Kwon, San Diego, CA (US); Satyanarayana Sahu, San Diego, CA (US); Divya Gangadharan, San Diego, CA (US); Chih-Iung Kao, San Diego, CA (US); Renukprasad Shreedhar Hiremath, San Diego, CA (US); Animesh Datta, San Diego, CA (US); Qi Ye, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/169,592

(22) Filed: Jan. 31, 2014

(65) Prior Publication Data

US 2015/0221639 A1 Aug. 6, 2015

(51) Int. Cl.
*H01L 27/00* (2006.01)
*H01L 27/088* (2006.01)
*H01L 29/06* (2006.01)
*G06F 17/50* (2006.01)
*H01L 23/528* (2006.01)

(52) U.S. Cl.
CPC .......... *H01L 27/088* (2013.01); *G06F 17/5072* (2013.01); *G06F 17/5081* (2013.01); *H01L 23/528* (2013.01); *H01L 29/0653* (2013.01)

(58) Field of Classification Search
CPC .............. H01L 27/0207; H01L 27/092; H01L 27/11521; H01L 29/42328; H01L 29/7834; H01L 29/42372; H01L 27/088; H01L 23/528; H01L 29/0653; H01P 27/115; G06F 17/5072; G06F 17/5081
See application file for complete search history.

(56) References Cited

U.S. PATENT DOCUMENTS

| 8,338,864 | B2 | 12/2012 | Katakura |
| 8,362,573 | B2 | 1/2013 | Wu et al. |
| 8,473,888 | B2 | 6/2013 | Guo et al. |
| 2012/0168875 | A1 | 7/2012 | Tamaru et al. |
| 2012/0254817 | A1 | 10/2012 | Sherlekar |
| 2013/0299890 | A1* | 11/2013 | OH et al. ...................... 257/306 |

* cited by examiner

*Primary Examiner* — Nikolay Yushin
(74) *Attorney, Agent, or Firm* — Arent Fox LLP

(57) ABSTRACT

A CMOS device including a standard cell includes first and second transistors with a gate between the first and second transistors. One active region extends between the first and second transistors and under the gate. In a first configuration, when drains/sources of the first and second transistors on the sides of the gate carry the same signal, the drains/sources are connected together and to the gate. In a second configuration, when a source of the first transistor on a side of the gate is connected to a source voltage and a drain/source of the second transistor on the other side of the gate carries a signal, the source of the first transistor is connected to the gate. In a third configuration, when sources of the first and second transistors on the sides of the gate are connected to a source voltage, the gate floats.

20 Claims, 10 Drawing Sheets

DIGITAL CIRCUIT DESIGN WITH SEMI-CONTINUOUS DIFFUSION STANDARD CELL

BACKGROUND

1. Field

The present disclosure relates generally to a layout construction, and more particularly, to digital circuit design with semi-continuous active regions within a standard cell.

2. Background

In a standard cell, some transistors may be separated by a trench using shallow trench isolation (STI). When silicon germanium/silicon carbide is formed in the source/drain regions of a transistor in order to improve mobility, the drive capability of the transistor can be degraded (the transistor may be slower) when the gate of the transistor is close to an STI region compared to transistors further from the STI region. Accordingly, apparatuses are needed to address this issue.

SUMMARY

In an aspect of the disclosure, an apparatus including a standard cell is provided. The apparatus may be a complementary metal oxide semiconductor (CMOS) device. The apparatus includes a first transistor having a first transistor drain and a first transistor source, and a second transistor having a second transistor drain and a second transistor source. The second transistor drain and the second transistor source are different than the first transistor drain and the first transistor source. The apparatus includes a gate extending between one of the first transistor drain or the first transistor source and one of the second transistor drain or the second transistor source. One active region extends between the first transistor and the second transistor and under the gate. The gate is connected to both the one of the first transistor drain or the first transistor source and the one of the second transistor drain or the second transistor source.

In an aspect of the disclosure, an apparatus including a standard cell is provided. The apparatus may be a CMOS device. The apparatus includes a first transistor having a first transistor drain and a first transistor source, and a second transistor having a second transistor drain and a second transistor source. The second transistor drain and the second transistor source are different than the first transistor drain and the first transistor source. The apparatus includes a gate extending between the first transistor source and the one of the second transistor drain or the second transistor source. One active region extends between the first transistor and the second transistor and under the gate. The first transistor source is connected to a source voltage. The gate is connected to the source voltage in order to turn off the gate. The one of the second transistor drain or the second transistor source is connected to a signal line and disconnected from the source voltage.

In an aspect of the disclosure, an apparatus including a standard cell is provided. The apparatus may be a CMOS device. The apparatus includes a first transistor having a first transistor drain and a first transistor source, and a second transistor having a second transistor drain and a second transistor source. The second transistor drain and the second transistor source are different than the first transistor drain and the first transistor source. The apparatus includes a gate extending between the first transistor source and the second transistor source. One active region extends between the first transistor and the second transistor and under the gate. The gate is floating. The first transistor source and the second transistor source are connected to a source voltage.

DETAILED DESCRIPTION

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts. Apparatuses and methods will be described in the following detailed description and may be illustrated in the accompanying drawings by various blocks, modules, components, circuits, steps, processes, algorithms, elements, etc.

Figure 1:
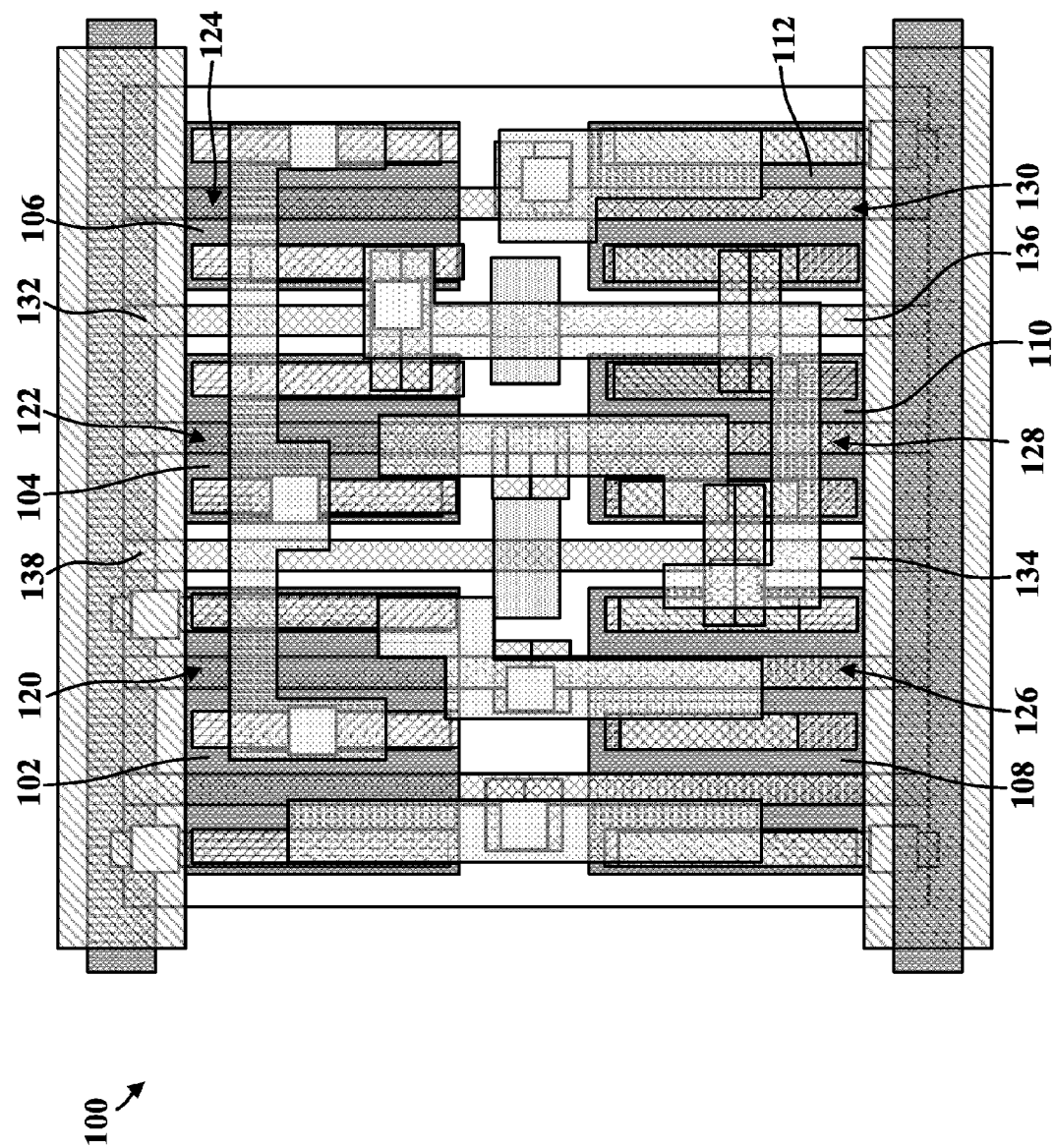
FIG. 1 is a diagram illustrating a layout of a CMOS device within a standard cell.

FIG. 1 is a diagram 100 illustrating a layout of a CMOS device within a standard cell. The CMOS device has p-channel metal oxide semiconductor (pMOS) active regions 102, 104, 106, and n-channel metal oxide semiconductor (nMOS) active regions 108, 110, 112. The pMOS and nMOS active regions may be referred to as oxide definition (OD) regions. STI regions are located between the active regions 102 and 104 and under the (dummy) gate 138; between active regions 104 and 106 and under the (dummy) gate 132; between active regions 108 and 110 and under the (dummy) gate 134; and between active regions 110 and 112 and under the (dummy) gate 136 in order to isolate the active regions from each other. Silicon germanium may be formed in OD regions of a pMOS transistor to improve carrier (electron/hole) mobility and silicon carbide may be formed in OD regions of an nMOS transistor to improve carrier mobility. If silicon germanium/silicon carbide is embedded into the source/drain regions of the transistors 120, 122, 124, 126, 128, 130, the drive capability of the transistors can be degraded (the transistor may be slower) with narrow source/drain regions when gates of the transistors are close to an adjacent STI region. Accordingly, the performance of the CMOS device may be degraded due to the use of the STI regions.

A standard cell with continuous pMOS and nMOS active regions and no STI regions may be utilized. However, there are issues associated with the use of a continuous active region standard cells. In order to overcome the aforementioned performance degradation issues, in exemplary embodiments, discontinuous active regions within a standard cell are made to be continuous under particular circumstances. In a first configuration (see FIG. 2), when drains/sources of transistors on sides of a (dummy) gate carry the same signal, the drains/sources of the transistors on the sides of the gate are connected together and to the gate. In a second configuration (see FIG. 3), when a source of a first transistor on a side of a (dummy) gate is connected to a source voltage and a drain/source of a second transistor on the other side of the gate carries a signal, the source of the first transistor is connected to the gate. In a third configuration (see FIG. 5), when sources of transistors on the sides of a (dummy) gate are connected to a source voltage, the gate floats. In each of the configurations, the active regions between the transistors on the sides of the gate and under the gate are made to be continuous, thereby providing a semi-continuous active region standard cell. The semi-continuous active region standard cell may be made to have continuous active regions if each of the discontinuous active regions within a standard cell meets the requirements of the first, second, and/or third configurations.

Figure 2:
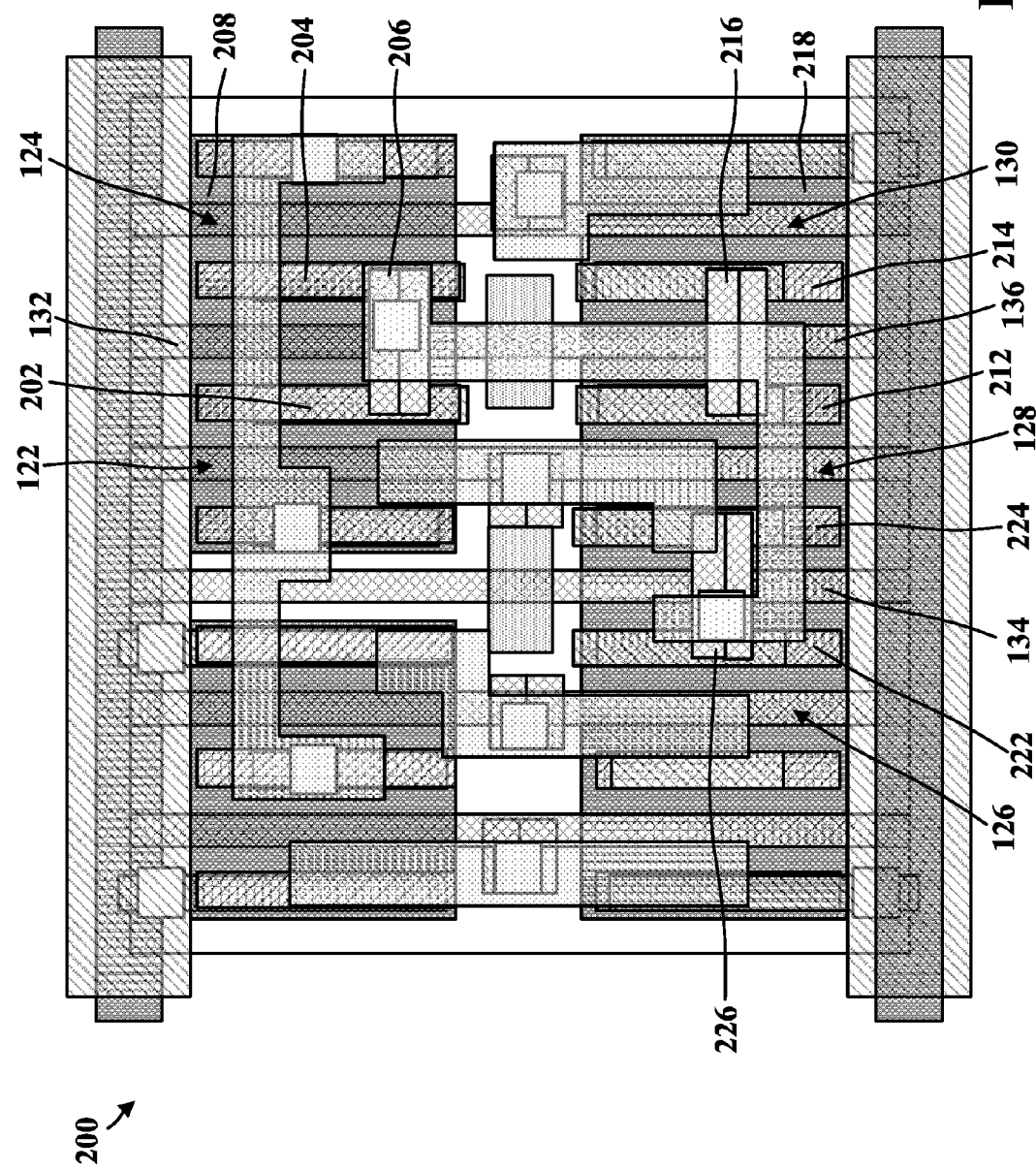
FIG. 2 is a diagram illustrating a first exemplary layout configuration.

FIG. 2 is a diagram 200 illustrating a first exemplary layout configuration. In a first configuration, when drains/sources of transistors on sides of a (dummy) gate carry the same signal (not a source voltage), the drains/sources of the transistors on the sides of the gate are connected together and to the gate. In addition, the active regions between the transistors on the sides of the gate and under the gate are made to be continuous. For example, as shown in FIG. 2, the drain 202 of the pMOS transistor 122 on the left side of the gate 132 is connected to the drain 204 of the pMOS transistor 124 on the right side of the gate 132. The drains 202, 204 carry the same signal, as they are connected together and are not connected to a source voltage. In the first embodiment, the drains 202, 204 are connected together and to the gate 132. The drains 202, 204 may be connected together and to the gate 132 with a metal poly (MP) layer interconnect 206. Further, the pMOS transistors 122, 124 have one continuous active region 208. The active region 208 extends between the transistor 122 and the transistor 124 and under the gate 132.

For another example, as shown in FIG. 2, the source 212 of the nMOS transistor 128 on the left side of the gate 136 is connected to the drain 214 of the nMOS transistor 130 on the right side of the gate 136. The source 212 and the drain 214 carry the same signal, as they are connected together and are not connected to a source voltage. In the first embodiment, the source 212 and the drain 214 are connected together and to the gate 136. The source 212 and the drain 214 may be connected together and to the gate 136 with an MP layer interconnect 216. Further, the nMOS transistors 128, 130 have one continuous active region 218. The active region 218 extends between the transistor 128 and the transistor 130 and under the gate 136. For yet another example, as shown in FIG. 2, the drain 222 of the nMOS transistor 126 on the left side of the gate 134 is connected to the drain 224 of the nMOS transistor 128 on the right side of the gate 134. The drains 222, 224 carry the same signal, as they are connected together and are not connected to a source voltage. In the first embodiment, the drains 222, 224 are connected together and to the gate 134. The drains 222, 224 may be connected together and to the gate 134 with an MP layer interconnect 226. Further, the nMOS transistors 126, 128 have one continuous active region 218. The active region 218 extends between the transistor 126 and the transistor 128 and under the gate 134.

Generally, in the first embodiment, an apparatus/CMOS device including a standard cell includes a first transistor having a first transistor drain and a first transistor source, a second transistor having a second transistor drain and a second transistor source. The second transistor drain and the second transistor source are different than the first transistor drain and the first transistor source. Further, a gate, which is not a gate of the first transistor or the second transistor, extends between one of the first transistor drain or the first transistor source and one of the second transistor drain or the second transistor source. One active region extends between the first transistor and the second transistor and under the gate. The gate is connected to both the one of the first transistor drain or the first transistor source and the one of the second transistor drain or the second transistor source. The first transistor and the second transistor may be pMOS transistors or nMOS transistors. Through the use of the first embodiment, a standard cell can be made to have more continuous active regions and fewer breaks in the active regions. Further, through the use of the first embodiment, discontinuous active regions and STI regions can be replaced with continuous active regions, thereby preventing degradation of the performance of the apparatus/CMOS device standard cell, especially when the active regions are embedded with silicon germanium or silicon carbide and the active regions are narrow.

Figure 3:
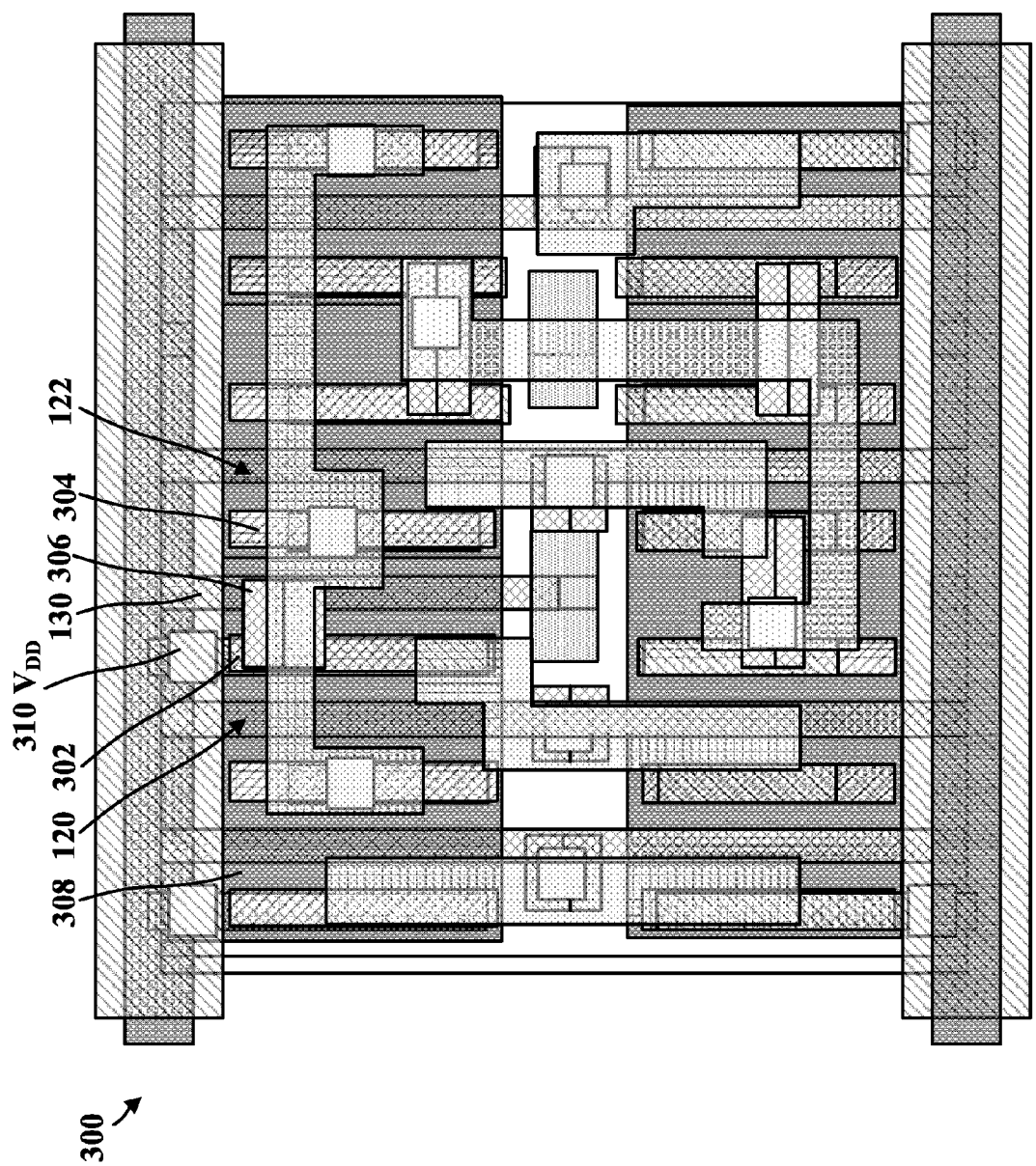
FIG. 3 is a diagram illustrating a second exemplary layout configuration.

FIG. 3 is a diagram 300 illustrating a second exemplary layout configuration. In a second configuration, when a source of a first transistor on a side of a (dummy) gate is connected to a source voltage and a drain/source of a second transistor on the other side of the gate carries a signal, the source of the first transistor is connected to the gate. In addition, the active regions between the transistors on the sides of the gate and under the gate are made to be continuous. For example, as shown in FIG. 3, the source 302 of the pMOS transistor 120 on the left side of the gate 130 is connected to a source voltage $V_{dd}$ at via 310. A source 304 of the pMOS transistor 122 on the right side of the gate carries a signal (is not connected to a source voltage). In the second embodiment, the source 302 is connected to the gate 130 in order to turn off the gate, which isolates the source 304 from the source 302. The source 302 may be connected to the gate 130 with an MP layer interconnect 306. Further, the pMOS transistors 120, 122 have one continuous active region 308. The active region 308 extends between the transistor 120 and the transistor 122 and under the gate 130.

Generally, in the second embodiment, an apparatus/CMOS device including a standard cell includes a first transistor having a first transistor drain and a first transistor source, a second transistor having a second transistor drain and a second transistor source. The second transistor drain and the second transistor source are different than the first transistor drain and the first transistor source. Further, a gate extends between the first transistor source and the one of the second transistor drain or the second transistor source. One active region extends between the first transistor and the second transistor and under the gate. The first transistor source is connected to a source voltage. The gate is connected to the source voltage in order to turn off the gate. The one of the second transistor drain or the second transistor source is connected to a signal line and disconnected from the source voltage. The first transistor and the second transistor may be pMOS transistors or nMOS transistors. Through the use of the second embodiment, a standard cell can be made to have more continuous active regions and fewer breaks in the active regions. Further, through the use of the second embodiment, discontinuous active regions and STI regions can be replaced with continuous active regions, thereby preventing degradation of the performance of the apparatus/CMOS device standard cell, especially when the active regions are embedded with silicon germanium or silicon carbide and the active regions are narrow.

Figure 4:
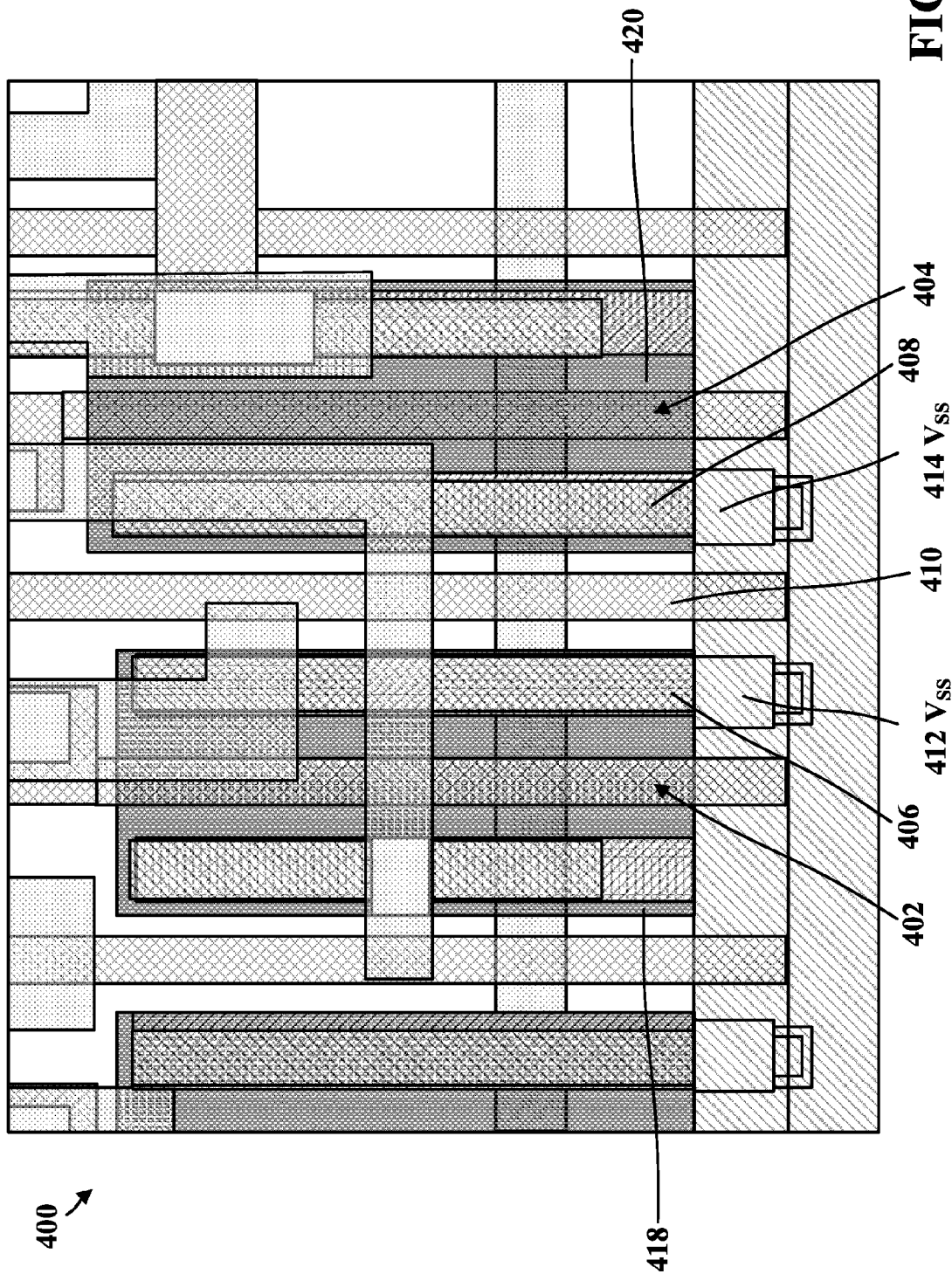
FIG. 4 is a diagram illustrating a layout of a CMOS device within a standard cell.

FIG. 4 is a diagram illustrating a layout of a CMOS device within a standard cell. As shown in FIG. 4, the source 406 of the nMOS transistor 402 is connected to a source voltage $V_{ss}$ at via 412 and the source 408 of the nMOS transistor 404 is connected to the source voltage $V_{ss}$ at via 414. The nMOS transistors 402, 404 have separate active regions 418, 420, respectively. An STI region is located below the gate 410 to isolate the active regions 418, 420 from each other.

Figure 5:
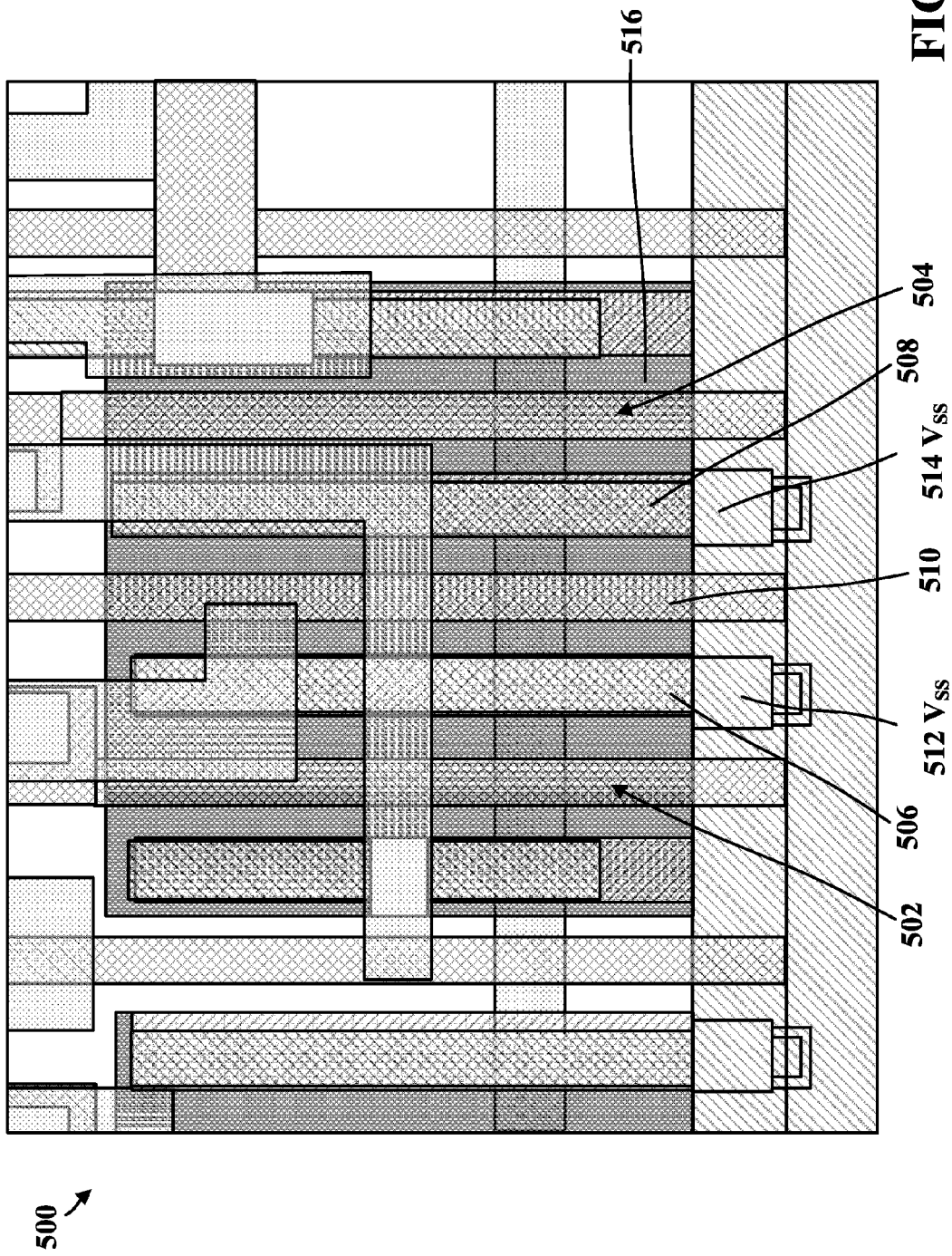
FIG. 5 is a diagram illustrating a third exemplary layout configuration.

FIG. 5 is a diagram 500 illustrating a third exemplary layout configuration. In a third configuration, when sources of transistors on the sides of a (dummy) gate are connected to a source voltage, the gate floats and is not tied to a particular voltage. In addition, unlike the layout shown in FIG. 4, one active region extends between the transistors and under the gate. For example, as shown in FIG. 5, the source 506 of the nMOS transistor 502 is connected to a source voltage $V_{ss}$ at via 512 and the source 508 of the nMOS transistor 504 is connected to the source voltage $V_{ss}$ at via 514. In the third embodiment, the gate 510 is floating. Further, the nMOS transistors 502, 504 have one continuous active region 516. The active region 516 extends between the transistor 502 and the transistor 504 and under the gate 510.

Generally, in the third embodiment, an apparatus/CMOS device including a standard cell includes a first transistor having a first transistor drain and a first transistor source, a second transistor having a second transistor drain and a second transistor source. The second transistor drain and the second transistor source are different than the first transistor drain and the first transistor source. Further, a gate extends between the first transistor source and the second transistor source. One active region extends between the first transistor and the second transistor and under the gate. The gate floats. The first transistor source and the second transistor source are connected to a source voltage. The first transistor and the second transistor may be pMOS transistors or nMOS transistors. Through the use of the third embodiment, a standard cell can be made to have more continuous active regions and fewer breaks in the active regions. Further, through the use of the third embodiment, discontinuous active regions and STI regions can be replaced with continuous active regions, thereby preventing degradation of the performance of the apparatus/CMOS device standard cell, especially when the active regions are embedded with silicon germanium or silicon carbide and the active regions are narrow.

Figure 6:
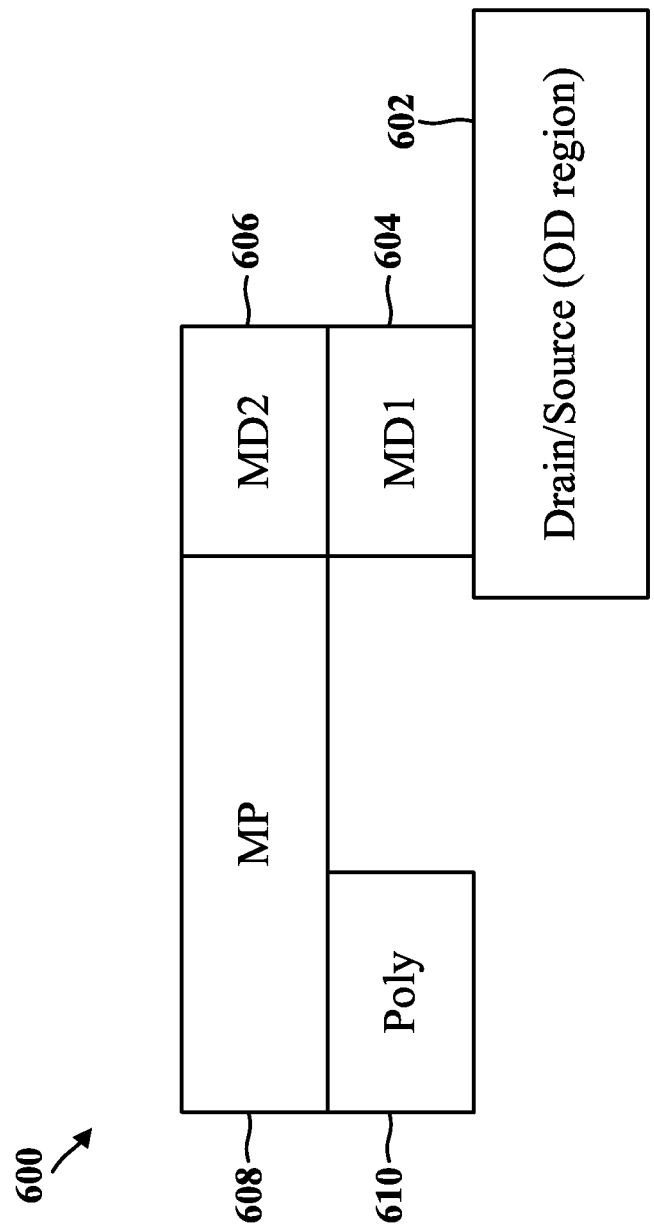
FIG. 6 is a diagram illustrating a side profile of the interconnects between a poly interconnect and a drain/source.

FIG. 6 is a diagram 600 illustrating a side profile of the interconnects between a poly interconnect and a drain/source. The poly interconnect 610 may be a metal interconnect, such as in a 20 nm process technology. However, in other process technologies, the poly interconnect 610 may be entirely polysilicon or may be polysilicon with a metal top layer. A first metal diffusion (MD) layer interconnect 604 is on the drain/source 602 (also referred to as OD region), and a second MD layer interconnect 606 is on the first MD layer interconnect 604. The first and second MD layers 604, 606 may be referred to as one MD layer. The MD layer connects directly to the drain/source 602. An MP layer interconnect 608 connects the poly interconnect 610 to the second MD interconnect 606. The MP layer connects directly to the poly interconnect 610. The MD and MP layers may be connected to a metal layer, such as the metal layer M1, through a via.

Figure 7:
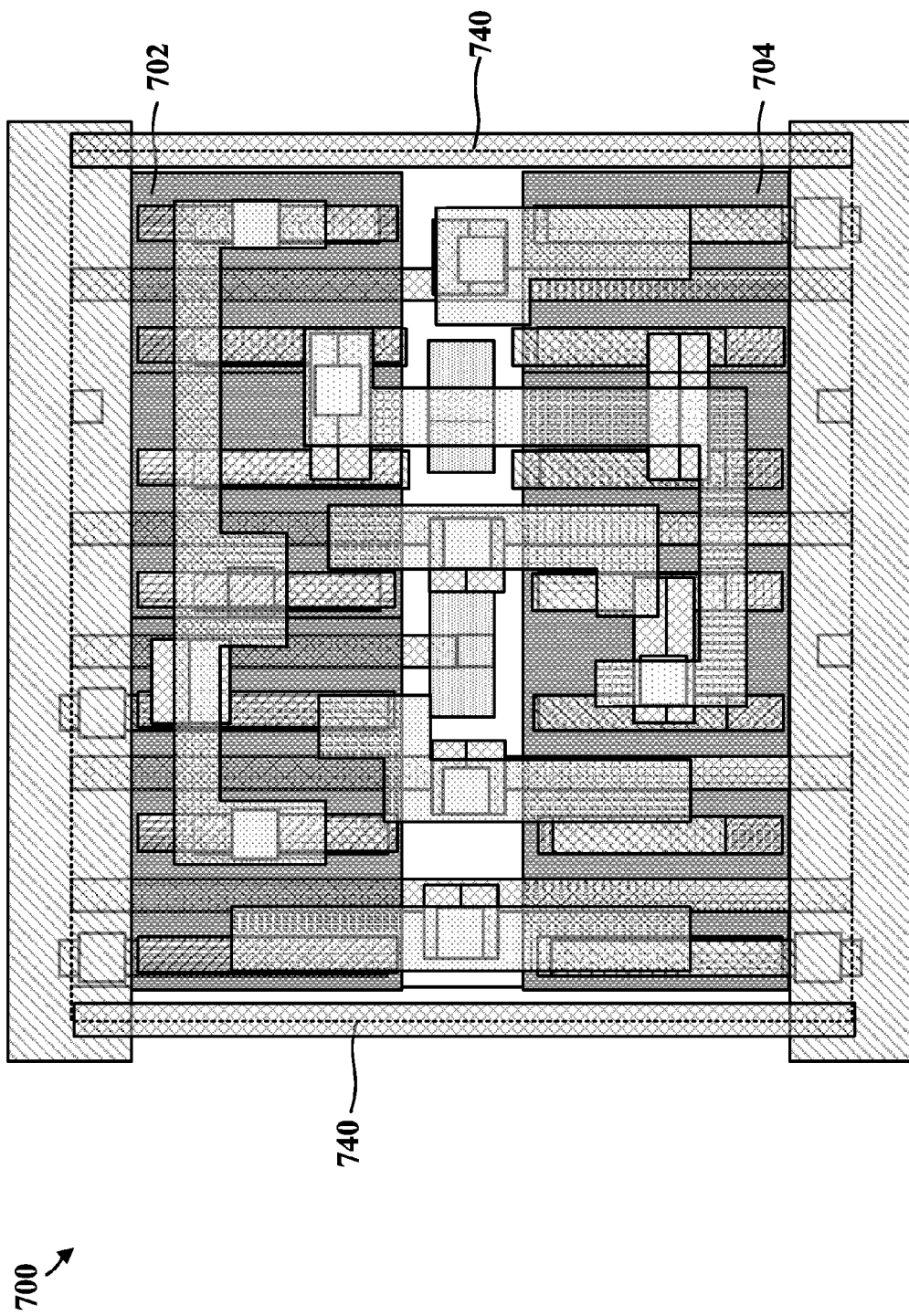
FIG. 7 is a diagram illustrating a standard cell with no change for the standard cell boundary.
Figure 8:
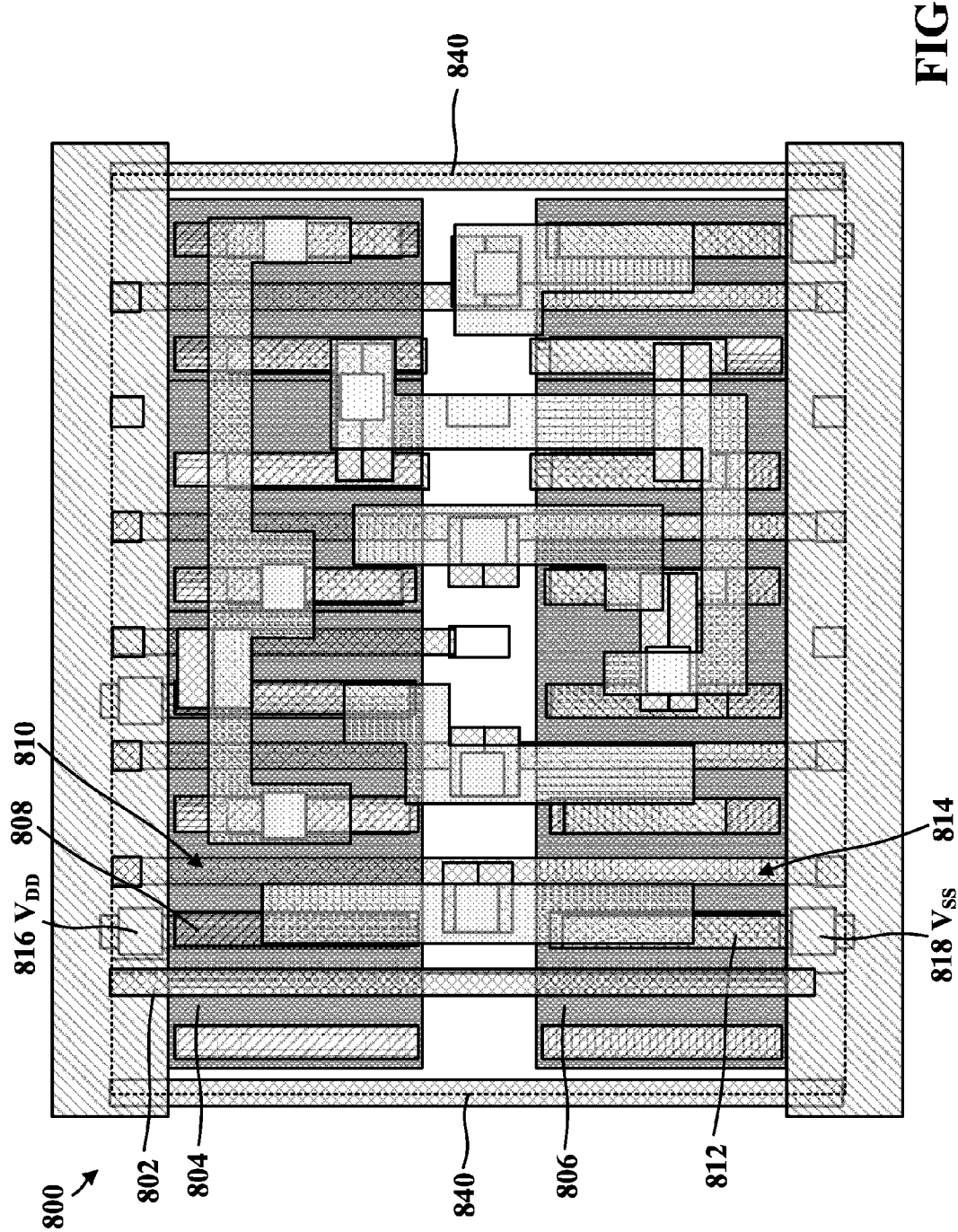
FIG. 8 is a diagram illustrating a dummy gate at one side of a standard cell.
Figure 9:
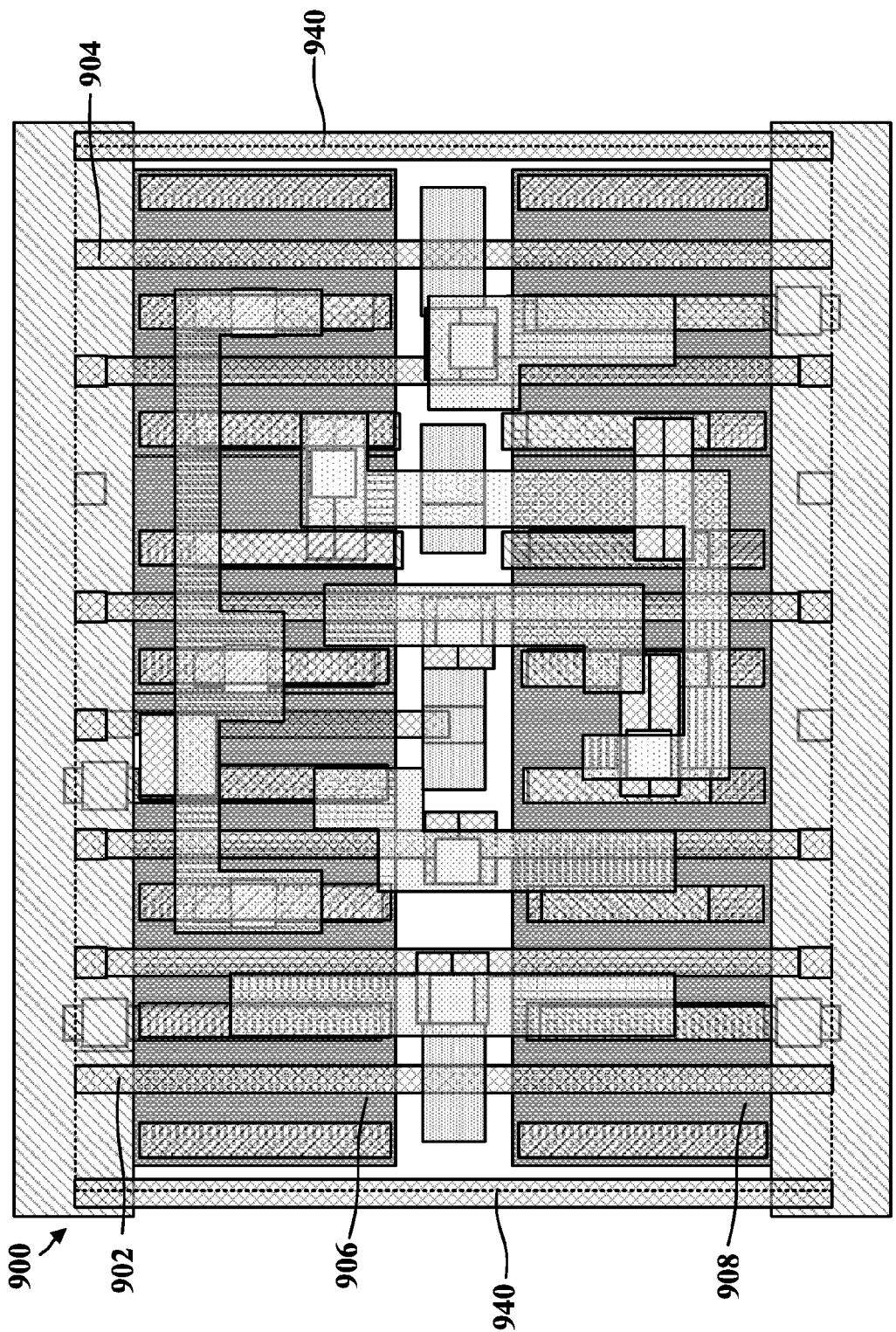
FIG. 9 is a diagram illustrating dummy gates at sides of a standard cell.
Figure 10:
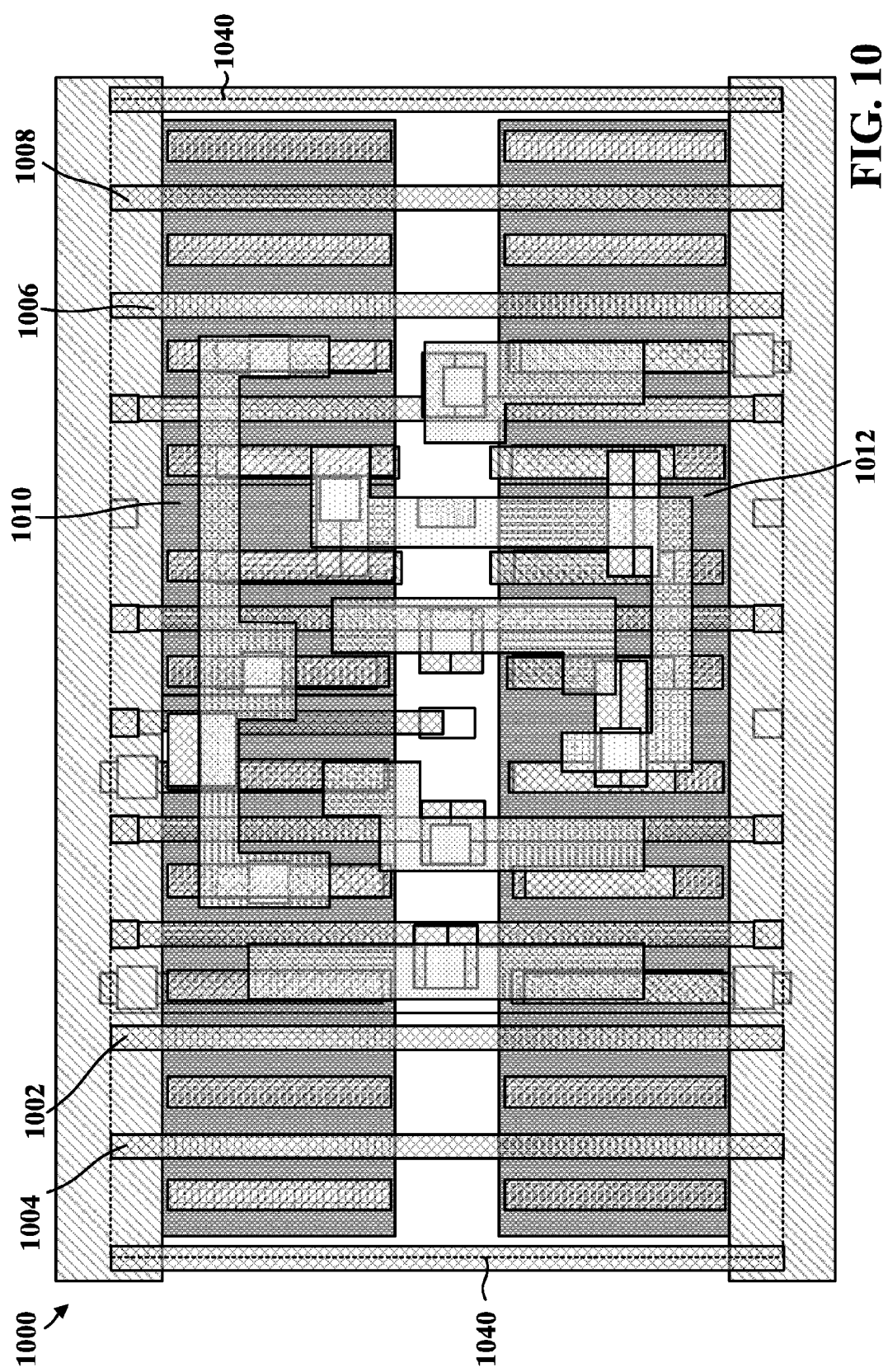
FIG. 10 is a diagram illustrating two dummy gates at sides of a standard cell.

FIG. 7 is a diagram 700 illustrating a standard cell with no change for the standard cell boundary 740 as compared to the standard cells illustrated in FIGS. 8-10. As shown in FIG. 7, discontinuous active regions may be made to be continuous pursuant to the first (see FIG. 2), second (see FIG. 3), and third (see FIG. 5) embodiments in order to provide a semi-continuous active region standard cell. The semi-continuous active region standard cell may have active regions 702, 704 that are made to be continuous if each of the discontinuous active regions within a standard cell meets the requirements of the first, second, and/or third configurations. STI regions may be located on sides of the standard cell in order to isolate adjacent standard cells from each other. In FIG. 7, the left and right sides of the standard cell may be isolated with STI regions within the standard cell under the dummy gates at the standard cell boundary 740, as the active regions 702 and 704 do not extend to the left edge of the standard cell.

FIG. 8 is a diagram 800 illustrating a dummy gate at one side of a standard cell. As shown in FIG. 8, a dummy gate 802 may be located at an edge of the standard cell and the adjacent pMOS active region 804 and the adjacent nMOS active region 806 may be continuous to extend under the dummy gate 802. The dummy gate 802 may be floating (not connected to any particular voltage). The dummy gate 802 increases a size of the standard cell boundary 840. In one configuration, the dummy gate 802 may be utilized when a source of a transistor is located adjacent to the edge of the standard cell and the source of the transistor is connected to a source voltage. For example, as shown in FIG. 8, the dummy gate 802 extends adjacent to the source 808 of the pMOS transistor 810 and adjacent to the source 812 of the nMOS transistor 814 in the standard cell. The source 808 is connected to a source voltage $V_{dd}$ at via 816 and the source 812 is connected to a source voltage $V_{ss}$ at via 818. The dummy gate 802 further isolates an adjacent standard cell by further separating the standard cells. The additional isolation reduces any performance degradation due to an influence of the voltage sources on the adjacent standard cell. STI regions may be located on sides of the standard cell outside of the gate 802 and under the dummy gates at the standard cell boundary 840 in order to further isolate adjacent standard cells from each other.

FIG. 9 is a diagram 900 illustrating dummy gates at sides of a standard cell. As shown in FIG. 9, a first dummy gate 902 may be located at an edge of the standard cell, the adjacent pMOS active region 906 may be continuous to extend under the first dummy gate 902, and the adjacent nMOS active region 908 may be continuous to extend under the first dummy gate 902. In addition, a second dummy gate 904 may be located at an edge of the standard cell, the adjacent pMOS active region 906 may be continuous to extend under the second dummy gate 904, and the adjacent nMOS active region 908 may be continuous to extend under the second dummy gate 904. The dummy gates 902 and 904 may be floating (not connected to any particular voltage). The dummy gates 902 and 904 increase a size of the standard cell boundary 940. STI regions may be located on sides of the standard cell outside of the gates 902, 904 and under the dummy gates at the standard cell boundary 940 in order to further isolate adjacent standard cells from each other.

FIG. 10 is a diagram 1000 illustrating two dummy gates at sides of a standard cell. As shown in FIG. 10, dummy gates 1002, 1004 may be located at a first edge of the standard cell, the adjacent pMOS active region 1010 may be continuous to extend under the dummy gates 1002, 1004, and the adjacent nMOS active region 1012 may be continuous to extend under the dummy gates 1002, 1004. In addition, dummy gates 1006, 1008 may be located at a second edge of the standard cell, the adjacent pMOS active region 1010 may be continuous to extend under the dummy gates 1008, 1008, and the adjacent nMOS active region 1012 may be continuous to extend under the dummy gates 1008, 1008. The dummy gates 1002, 1004, 1006, and 1008 may be floating (not connected to any particular voltage). The dummy gates 1002, 1004, 1006, 1008 increase a size of the standard cell boundary 1040. An STI region may extend outside the first and second edges of the standard cell. For example, a first STI region may extend outside the dummy gate 1004 and a second STI region may extend outside the dummy gate 1008. The first and second STI regions may extend under the dummy gates at the standard cell boundary 1040.

It is understood that the specific order or hierarchy of steps in the processes disclosed is an illustration of exemplary approaches. Based upon design preferences, it is understood that the specific order or hierarchy of steps in the processes may be rearranged. Further, some steps may be combined or omitted. The accompanying method claims present elements of the various steps in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." The word "exemplary" is used herein to mean "serving as an example, instance, or illustration." Any aspect described herein as "exemplary" is not necessarily to be construed as preferred or advantageous over other aspects." Unless specifically stated otherwise, the term "some" refers to one or more. Combinations such as "at least one of A, B, or C," "at least one of A, B, and C," and "A, B, C, or any combination thereof" include any combination of A, B, and/or C, and may include multiples of A, multiples of B, or multiples of C. Specifically, combinations such as "at least one of A, B, or C," "at least one of A, B, and C," and "A, B, C, or any combination thereof" may be A only, B only, C only, A and B, A and C, B and C, or A and B and C, where any such combinations may contain one or more member or members of A, B, or C. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed as a means plus function unless the element is expressly recited using the phrase "means for."

What is claimed is:

1. An apparatus including a standard cell, comprising:
   a first transistor having a first transistor drain and a first transistor source;
   a second transistor having a second transistor drain and a second transistor source, the second transistor drain and the second transistor source being different than the first transistor drain and the first transistor source; and
   a gate extending between one of the first transistor drain or the first transistor source and one of the second transistor drain or second transistor source, one active region extending between the first transistor and the second transistor and under the gate, the gate being connected to both the one of the first transistor drain or the first transistor source and the one of the second transistor drain or the second transistor source.

2. The apparatus of claim 1, wherein the first transistor and the second transistor are p-channel metal oxide semiconductor (pMOS) transistors or n-channel metal oxide semiconductor (nMOS) transistors.

3. The apparatus of claim 1, further comprising a dummy gate at an edge of the standard cell, wherein the one active region is continuous to extend under the dummy gate.

4. The apparatus of claim 3, wherein the dummy gate extends adjacent a source of a transistor in the standard cell, the source of the transistor being connected to a source voltage.

5. The apparatus of claim 3, further comprising a second dummy gate at a second edge of the standard cell opposite to said edge of the standard cell, and the active region is continuous to extend under the second dummy gate.

6. The apparatus of claim 5, further comprising a third dummy gate at the edge of the standard cell and a fourth dummy gate at the second edge of the standard cell, wherein the active region is continuous to extend below the dummy gate and the third dummy gate at the edge of the standard cell and below the second dummy gate and the fourth dummy gate at the second edge of the standard cell, the apparatus further comprising a shallow trench isolation (STI) region extending outside said edge and said second edge of the standard cell.

7. The apparatus of claim 1, wherein the gate is connected to both the one of the first transistor drain or the first transistor source and the one of the second transistor drain or the second transistor source by a metal poly (MP) layer interconnect.

8. An apparatus including a standard cell, comprising:
   a first transistor having a first transistor drain and a first transistor source;
   a second transistor having a second transistor drain and a second transistor source, the second transistor drain and the second transistor source being different than the first transistor drain and the first transistor source; and
   a gate extending between the first transistor source and the one of the second transistor drain or the second transistor source, one active region extending between the first transistor and the second transistor and under the gate, the first transistor source being connected to a source voltage, the gate being connected to the source voltage in order to turn off the gate, the one of the second transistor drain or the second transistor source being connected to a signal line and disconnected from the source voltage.

9. The apparatus of claim 8, wherein the first transistor and the second transistor are p-channel metal oxide semiconductor (pMOS) transistors or n-channel metal oxide semiconductor (nMOS) transistors.

10. The apparatus of claim 8, further comprising a dummy gate at an edge of the standard cell, wherein the one active region is continuous to extend under the dummy gate.

11. The apparatus of claim 10, wherein the dummy gate extends adjacent a source of a transistor in the standard cell, the source of the transistor being connected to a source voltage.

12. The apparatus of claim 10, further comprising a second dummy gate at a second edge of the standard cell opposite to said edge of the standard cell, and the active region is continuous to extend under the second dummy gate.

13. The apparatus of claim 12, further comprising a third dummy gate at the edge of the standard cell and a fourth dummy gate at the second edge of the standard cell, wherein the active region is continuous to extend below the dummy gate and the third dummy gate at the edge of the standard cell and below the second dummy gate and the fourth dummy gate at the second edge of the standard cell, the apparatus further comprising a shallow trench isolation (STI) region extending outside said edge and said second edge of the standard cell.

14. The apparatus of claim 8, wherein the first transistor source is connected to the gate by a metal poly (MP) layer interconnect.

15. An apparatus including a standard cell, comprising:
a first transistor having a first transistor drain and a first transistor source;
a second transistor having a second transistor drain and a second transistor source, the second transistor drain and the second transistor source being different than the first transistor drain and the first transistor source; and
a gate extending between the first transistor source and the second transistor source, one active region extending between the first transistor and the second transistor and under the gate, the gate floating, and the first transistor source and the second transistor source being connected to a source voltage.

16. The apparatus of claim 15, wherein the first transistor and the second transistor are p-channel metal oxide semiconductor (pMOS) transistors or n-channel metal oxide semiconductor (nMOS) transistors.

17. The apparatus of claim 15, further comprising a dummy gate at an edge of the standard cell, wherein the one active region is continuous to extend under the dummy gate.

18. The apparatus of claim 17, wherein the dummy gate extends adjacent a source of a transistor in the standard cell, the source of the transistor being connected to a source voltage.

19. The apparatus of claim 17, further comprising a second dummy gate at a second edge of the standard cell opposite to said edge of the standard cell, and the active region is continuous to extend under the second dummy gate.

20. The apparatus of claim 19, further comprising a third dummy gate at the edge of the standard cell and a fourth dummy gate at the second edge of the standard cell, wherein the active region is continuous to extend below the dummy gate and the third dummy gate at the edge of the standard cell and below the second dummy gate and the fourth dummy gate at the second edge of the standard cell, the apparatus further comprising a shallow trench isolation (STI) region extending outside said edge and said second edge of the standard cell.

* * * * *